US 6,617,584 B2

(12) United States Patent
Choo et al.

(10) Patent No.: US 6,617,584 B2
(45) Date of Patent: Sep. 9, 2003

(54) X-RAY DETECTING DEVICE AND FABRICATING METHOD THEREOF

(75) Inventors: Kyo Seop Choo, Seoul (KR); June Ho Park, Masan-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/888,495

(22) Filed: Jun. 26, 2001

(65) Prior Publication Data

US 2002/0084419 A1 Jul. 4, 2002

(30) Foreign Application Priority Data

Dec. 29, 2000 (KR) ...................... P2000-85278

(51) Int. Cl.$^7$ ................................. G01T 7/00
(52) U.S. Cl. ..................... 250/370.01; 250/370.08
(58) Field of Search ............... 250/370.01, 370.08, 250/370.09, 370.11, 370.12, 363.02; 257/546, 350; 349/42, 43; 438/98

(56) References Cited

U.S. PATENT DOCUMENTS 6,323,490 B1 * 11/2001 Ikeda et al. ............. 250/370.09
6,326,249 B1 * 12/2001 Yamazaki et al. ........... 438/158
6,403,965 B1 * 6/2002 Ikeda et al. ............. 250/370.09
6,480,577 B1 * 11/2002 Izumi et al. .................. 379/40
6,507,026 B2 * 1/2003 Ikeda et al. ............. 250/370.09
2001/0022363 A1 * 9/2001 Nagata et al. ................. 257/59
2002/0123176 A1 * 9/2002 Izumi et al. ................. 438/149
2002/0154235 A1 * 10/2002 Kim .......................... 348/311

* cited by examiner

Primary Examiner—Constantine Hannaher
Assistant Examiner—Otilia Gabor
(74) Attorney, Agent, or Firm—Birch, Stewart, Kolasch & Birch, LLP

(57) ABSTRACT

A X-ray detecting device and a fabricating method thereof that is capable of preventing a contact badness among a drain electrode, a ground electrode and a transparent electrode. In the device, first and second auxiliary electrodes are formed from the same metal material as the gate electrode. Accordingly, the first and second auxiliary electrodes are provided such that the drain electrode and the ground electrode are electrically connected to the transparent electrode with the aid of the first and second auxiliary electrodes even though they are over-etched.

28 Claims, 22 Drawing Sheets

X-RAY DETECTING DEVICE AND FABRICATING METHOD THEREOF

BACKGROUND OF THE INVENTION

1. Field of the Invention

This invention relates to an X-ray detector, and more particularly to an X-ray detecting device and a fabricating method thereof that is capable of preventing a contact badness among a drain electrode, a ground electrode and a transparent electrode.

2. Description of the Related Art

Generally, an X-ray imaging system photographing an object using a non-visible light ray such as an X-ray, etc. has been used for medical, science and industry applications. This X-ray imaging system includes an X-ray detecting panel for detecting an X-ray passing through an object to convert it into an electrical signal.

As shown in FIG. 1, the X-ray detecting panel includes a photo sensitive layer 6 for detecting an X-ray, and a thin film transistor substrate for switching and outputting the detected X-ray from the photo-sensitive layer 4. The thin film transistor substrate includes pixel electrodes 34 arranged in a pixel unit, and thin film transistors (TFT's), each of which is connected to a charging capacitor Cst, a gate line 2 and a data line (not shown) On the upper portion of the photo sensitive layer 4 is provided a dielectric layer 6 and an upper electrode 8 which is connected to a high voltage generator 10. The photo sensitive layer 4 made from a selenium with a thickness of hundreds of $\mu$m detects an incident X-ray to convert it into an electrical signal. In other words, the photo sensitive layer 4 produces an electron-hole pair when an X-ray is incident thereto, and separates the electron-hole pair when a high voltage of several kV is applied from the high voltage generator 10 to the upper electrode 8. The pixel electrode 34 plays a role to charge holes produced by X-ray detection from the photo sensitive layer 6 into the charging capacitor Cst. The thin film transistor (TFT) responds a gate signal inputted over the gate line 2 to apply a voltage charged in the charging capacitor Cst to the data line. Pixel signals supplied to the data line is applied, via a data reproducer, to a display device, thereby displaying a picture.

Referring to FIG. 2 and FIG. 3, in the thin film transistor substrate, the pixel electrode 34 is formed at a unit pixel area defined by the gate line 2 and a data line 42. The charging capacitor Cst is formed by the pixel electrode 34 and a transparent electrode 30 positioned at the lower portion of the pixel electrode 34 with having a storage insulation layer 32 therebetween. A ground electrode 20 is formed in a direction crossing the pixel electrode 34 to reset the residual electric charges of the charging capacitor Cst. The ground electrode 34 is electrically coupled, via a ground contact hole 26b, to the transparent electrode 30.

The thin film transistor (TFT) is formed at an intersection between the data line 42 and the gate line 3. The TFT consists of a gate electrode 36 extended from the gate line 2, a source electrode 38 extended from the data line 42, a drain electrode 40 connected, via drain contact holes 24a, 26a and 28a, to the pixel electrode 34, and semiconductor layers 14 and 16 for defining a conductive channel between the source electrode 38 and the drain electrode 40.

FIG. 4A to FIG. 4h shows a method of fabricating the X-ray detecting device shown in FIG. 2 step by step.

Referring first to FIG. 4A, the gate electrode 36 and the gate line 2 are provided on the substrate 1.

The gate electrode 36 and the gate line 2 are formed by depositing a metal material using a deposition technique such as a sputtering, etc. to form a conductive layer and then patterning the conductive layer. The gate electrode 36 and the gate line 2 are formed from a metal material such as an aluminum ally, and are preferably formed from aluminum-neodymium/molybdenum (AlNd/Mo).

Referring to FIG. 4B, an active layer 14 and an ohmic contact layer 16 are provided on a gate insulating film 12.

The gate insulating film 12 is formed by entirely depositing an insulating material, such as silicon nitride ($SiN_x$) or silicon oxide ($SiO_x$), onto the substrate 1 by the plasma enhanced chemical vapor deposition (PECVD) technique in such a manner to cover the gate line 2 and the gate electrode 36.

The active layer 14 and the ohmic contact layer 16 are formed by sequentially disposing first and second semiconductor material layers 14 and 16 on the gate insulating film 12 and then patterning them. The active layer 14 is formed from a first semiconductor material, that is, amorphous silicon that is not doped with an impurity. On the other hand, the ohmic contact layer 16 is formed from a second semiconductor material, that is, amorphous silicon doped with an n-type or p-type impurity at a high concentration.

Referring to FIG. 4C, the data line 42, the ground electrode 20, the source electrode 38 and the drain electrode 40 are provided on the gate insulating film 12.

The data line 42, the ground electrode 20 and the source and drain electrodes 38 and 40 are formed by depositing a metal material using the CVD technique or the sputtering technique and then patterning the metal material. After the source and drain electrodes 38 and 40 were patterned, the ohmic contact layer 16 at an area corresponding to the gate electrode 36 also is patterned to expose the active layer 14. A portion of the active layer 14 exposed by the source and drain electrodes 38 and 40 serves as a channel. The data line 42, the ground electrode 20, and the source and drain electrodes 38 and 40 are made from chrome (Cr) or molybdenum (Mo).

Referring to FIG. 4D, a first protective layer 18 are provided on the gate insulating layer 12.

The first protective layer 18 is formed by depositing an inorganic insulating material on the gate insulating layer 12 in such a manner to cover the data line 42, the ground electrode 20 and the source and drain electrodes 38 and 40 and then patterning it. The first protective layer 18 is preferably made from silicon nitride ($SiN_x$) or silicon oxide ($SiO_x$), etc.

The first protective layer is provided with a first ground contact hole 24b and a first drain contact hole 24a. The ground electrode 20 is exposed by the first ground contact hole 24b passing through the first protective layer 18. The drain electrode 40 is exposed by the first drain contact hole 24a passing through the first protective layer 18.

Referring to FIG. 4E, an organic insulating layer 22 are provided on the first protective layer 18. The organic insulating layer 22 is formed by depositing an organic insulating material, such as an acrylic organic compound, Teflon, BCB (benzocyclobutene), Cytop or PFCB (perfluorocyclobutane), etc., on the first protective layer 18 and then patterning it.

This organic insulating layer 22 is provided with a second drain contact hole 26a and a second ground contact hole 26b. Each of the second drain contact hole 26a and the second ground contact hole 26b has a width smaller than each of the first drain contact hole 24a and the first ground contact hole 24b. The drain electrode 40 is exposed by the second drain contact hole 26a passing through the organic insulating layer 22. The ground electrode 20 is exposed by the second ground contact hole 26b passing through the organic insulating layer 22.

Referring to FIG. 4F, a transparent electrode 30 is provided on the organic insulating layer 22.

The transparent electrode 30 is formed by depositing a transparent conductive material onto the organic insulating layer 22 and then patterning the deposited transparent conductive material. The transparent electrode 30 is made from a transparent material such as indium-tin-oxide (ITO), indium-zinc-oxide (IZO) or indium-tin-zinc-oxide (ITZO).

The transparent electrode 30 is electrically connected, via the second drain contact hole 26a, to the drain electrode 40 while being electrically connected, via the second ground contact hole 26b, to the ground electrode 20.

Referring to FIG. 4G, a second protective layer 32 is provided on the organic insulating layer 22.

The second protective layer 32 is formed by depositing an insulating material such as silicon nitride (SiN$_x$) or silicon oxide (SiO$_x$) and then patterning it in such a manner to cover the transparent electrode 30.

The second protective layer 32 is provided with a third drain contact hole 28a and a third ground contact hole 28b. Each of the third drain contact hole 28a and the third ground contact hole 28b has a width smaller than each of the second drain contact hole 26a and the second ground contact hole 26b. The transparent electrode 30 is exposed by the third drain contact hole 28a passing through the second protective layer 32.

Referring to FIG. 4H, the pixel electrode 34 is provided on the second protective layer 32.

The pixel electrode 34 is formed by depositing a transparent conductive material on the second protective layer 32 and then patterning the deposited transparent conductive material.

The pixel electrode 34 is electrically connected, via the first to third drain contact holes 24a, 26a and 28a, to the drain electrode 40. The pixel electrode 34 is made from a transparent conductive material such as indium-tin-oxide (ITO), indium-zinc-oxide (IZO) or indium-tin-zinc-oxide (ITZO).

In the X-ray detecting device as described above, when the organic insulating material 22 is formed by the photolithography including a dry etching after the ground electrode 20 and the drain electrode 40 were formed from chrome (Cr), the contact holes 24a and 24b are defined to expose the ground electrode 20 and the drain electrode 40. The ground electrode 20 and the drain electrode 40 are electrically connected, via the contact holes 24a and 24b, to the transparent electrode 30.

However, when the organic insulating material 22 is formed by the photolithography including a dry etching after the ground electrode 20 and the drain electrode 40 were formed from molybdenum (Mo), the ground electrode 20 and the drain electrode 40 also are over-etched to have a difficulty in setting a dry etching condition of the organic insulating layer 22. This causes a drawback in that only the side surfaces of the over-etched ground and drain electrodes 20 and 40 should be in contact with the transparent electrode 30, to thereby generate a contact badness.

SUMMARY OF THE INVENTION

Accordingly, it is an object of the present invention to provide an X-ray detecting device and a fabricating method thereof that is capable of preventing a contact badness among a drain electrode, a ground electrode and a transparent electrode.

In order to achieve these and other objects of the invention, an X-ray detecting device according to one aspect of the present invention includes an auxiliary electrode formed on a substrate simultaneously with a gate electrode; a drain electrode electrically connected to the auxiliary electrode; and a transparent electrode electrically connected, via a contact hole passing through the drain electrode, to the auxiliary electrode.

The X-ray detecting device further includes a gate insulating film formed in such a manner to cover the auxiliary electrode; a semiconductor layer formed in such a manner to correspond to the auxiliary electrode and the gate electrode; and a contact hole passing through the gate insulating film and the semiconductor layer to expose the auxiliary electrode.

In the X-ray detecting device, the auxiliary electrode is formed from aluminum-neodymium/molybdenum (AlNd/Mo). The drain electrode is formed from molybdenum (Mo).

Meanwhile, the X-ray detecting device further includes an auxiliary electrode formed simultaneously with the gate electrode; a ground electrode electrically connected to the second auxiliary electrode; and a transparent electrode electrically connected, via a contact hole passing through the ground electrode, to the auxiliary electrode.

The X-ray detecting device further includes a gate insulating film formed on the substrate in such a manner to cover the auxiliary electrode; a semiconductor layer formed on the gate insulating film; and a cont passing through the gate insulating film and the semiconductor layer to expose the auxiliary electrode.

In the X-ray detecting device, the auxiliary electrode is formed from aluminum-neodymium/molybdenum (AlNd/Mo). The ground electrode is formed from molybdenum (Mo).

A method of fabricating an X-ray detecting device according to another aspect of the present invention includes the steps of forming an auxiliary electrode on a substrate simultaneously with a gate electrode; forming a gate insulating film on the substrate in such a manner to cover the gate electrode and the auxiliary electrode; forming a semiconductor layer on the gate insulating film; forming a first contact hole passing through the semiconductor layer and the gate insulating film to expose the auxiliary electrode; and forming a source electrode on the gate insulating film and simultaneously forming a drain electrode opposed to the source electrode and electrically connected to the auxiliary electrode.

The fabricating method further includes the steps of forming a first protective layer on the gate insulating film in such a manner to cover the source and drain electrode; forming an insulating layer on the first protective layer; forming a second contact hole passing through at least one of the insulating layer and the drain electrode; forming a transparent electrode electrically connected, via the second contact hole, to at least one of the drain electrode and the auxiliary electrode; forming a second protective layer on the insulating layer; and forming a pixel electrode electrically connected to the transparent electrode on the second protective layer.

In the method, the insulating layer is made from an organic insulating material. The first and second protective layers are made from an inorganic insulating material. The auxiliary electrode is formed from aluminum-neodymium/ molybdenum (AlNd/Mo). The drain electrode is formed from molybdenum (Mo).

Meanwhile, the fabricating method further includes the steps of forming an auxiliary electrode on the substrate simultaneously with the gate electrode; forming a gate insulating film on the substrate in such a manner to cover the auxiliary electrode; forming a semiconductor layer on the gate insulating film; forming a first contact hole passing through the semiconductor layer and the gate insulating film to expose the auxiliary electrode; and forming a ground electrode electrically connected to the auxiliary electrode on the substrate.

The fabricating method further includes the steps of forming a first protective layer on the gate insulating film in such a manner to cover the ground electrode; forming an insulating layer on the first protective layer; forming a second contact hole passing through at least one of the insulating layer and the ground electrode; forming a transparent electrode electrically connected, via the second contact hole, to at least one of the ground electrode and the auxiliary electrode; forming a second protective layer on the insulating layer; and forming a pixel electrode on the second protective layer.

In the fabricating method, the auxiliary electrode is formed from aluminum-neodymium/molybdenum (AlNd/Mo). The ground electrode is formed from molybdenum (Mo). The first and second protective layers are made from an inorganic insulating material. The insulating layer is made from an organic insulating material.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Figure 1:
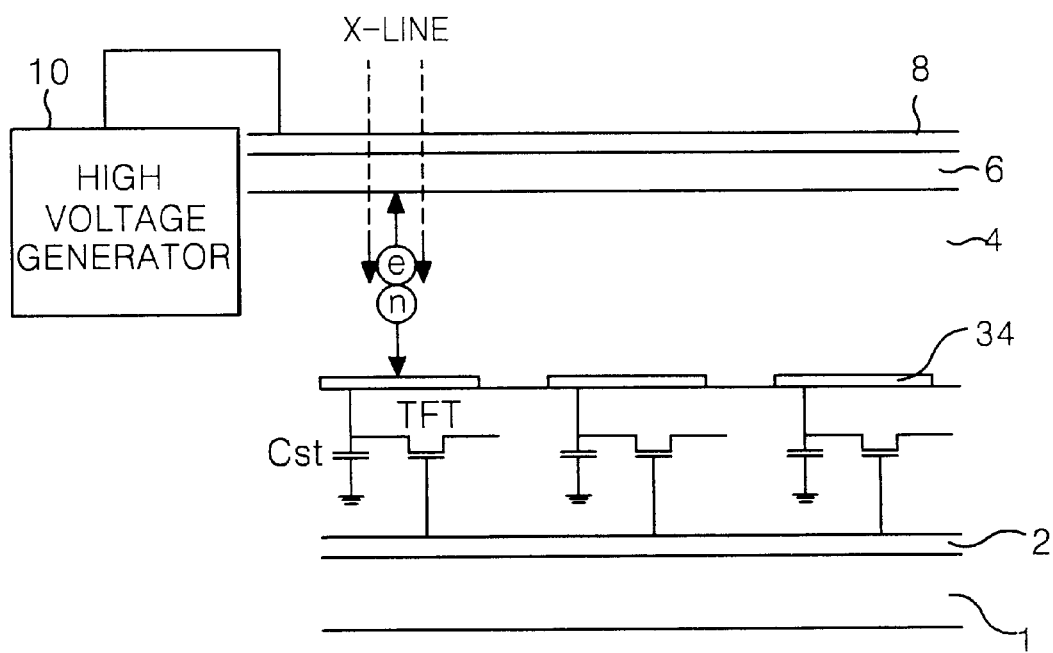
FIG. 1 is a schematic block circuit view showing a panel structure of a conventional X-ray detecting device.
Figure 2:
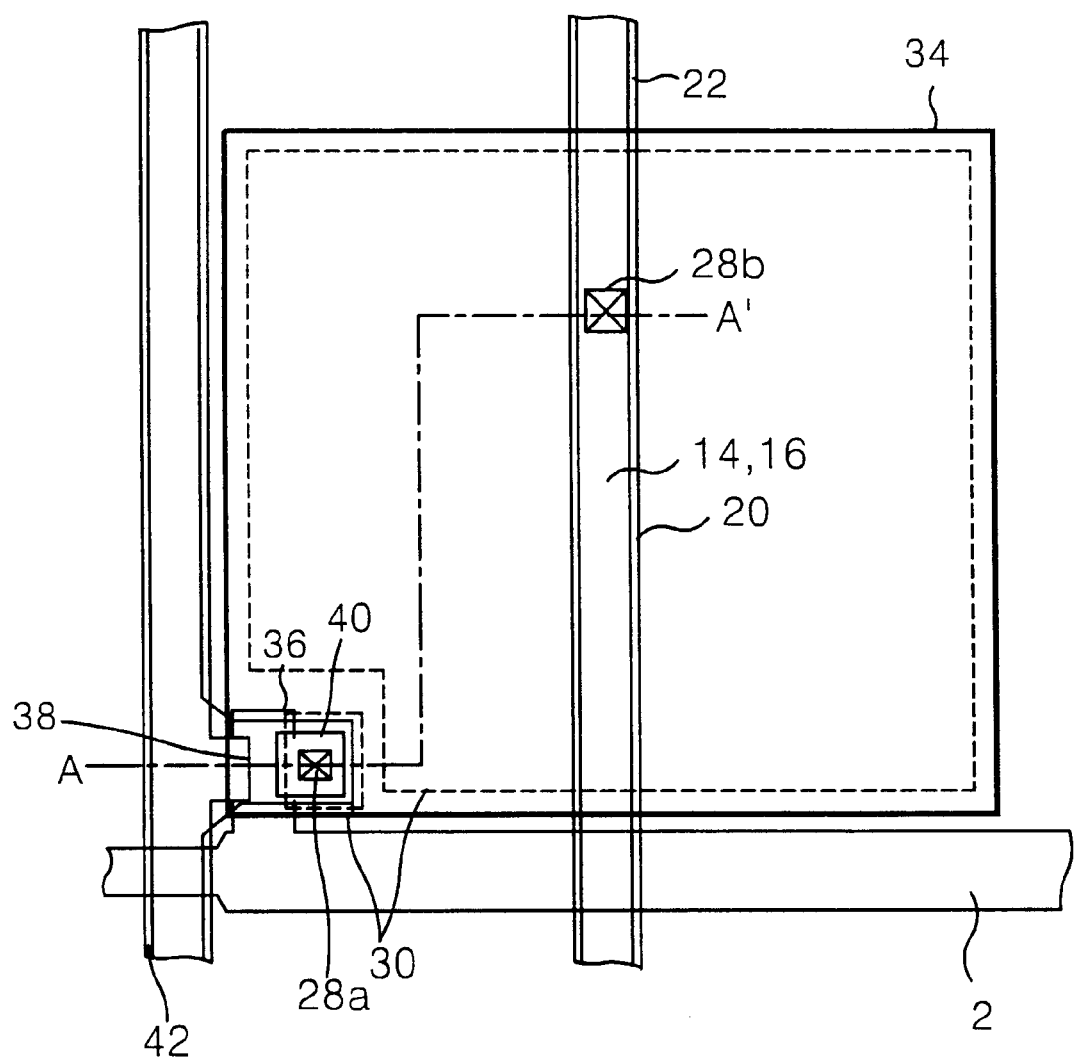
FIG. 2 is a plan view showing a structure of the X-ray detecting device shown in FIG. 1.
Figure 3:
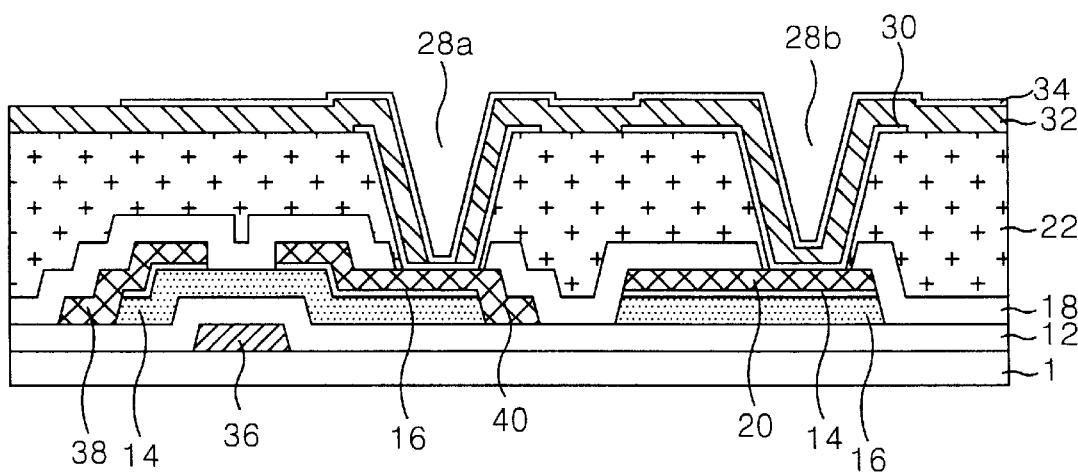
FIG. 3 is a section view of the X-ray detecting device taken along the A–A' line in FIG. 2.
Figure 4A:
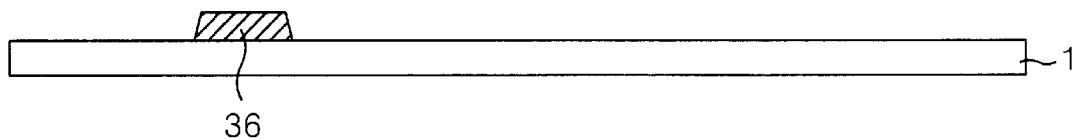
FIG. 4A to FIG. 4H are section views showing a method of fabricating the X-ray detecting device shown in FIG. 3 step by step.
Figure 4B:
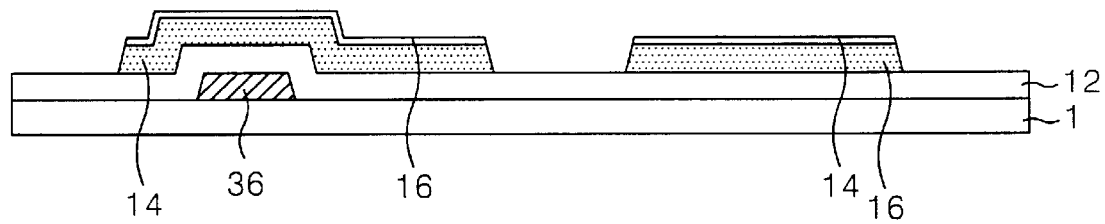
Figure 4C:
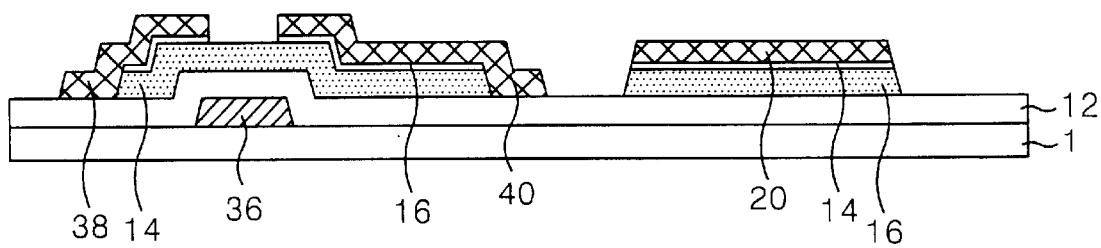
Figure 4D:
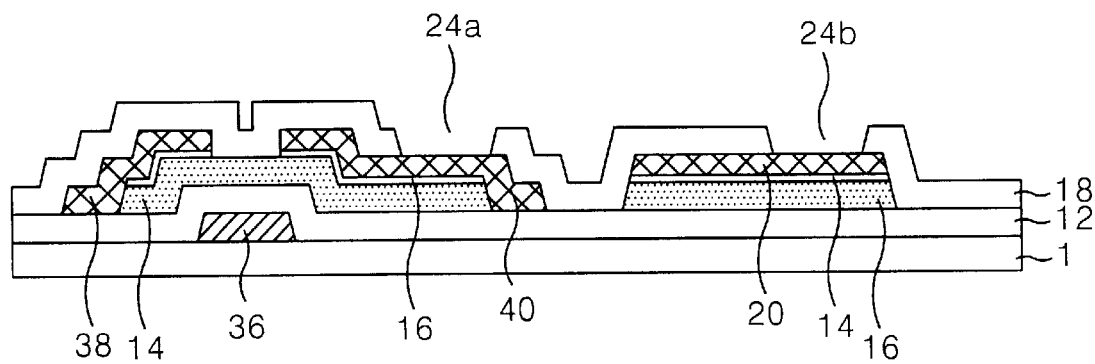
Figure 4E:
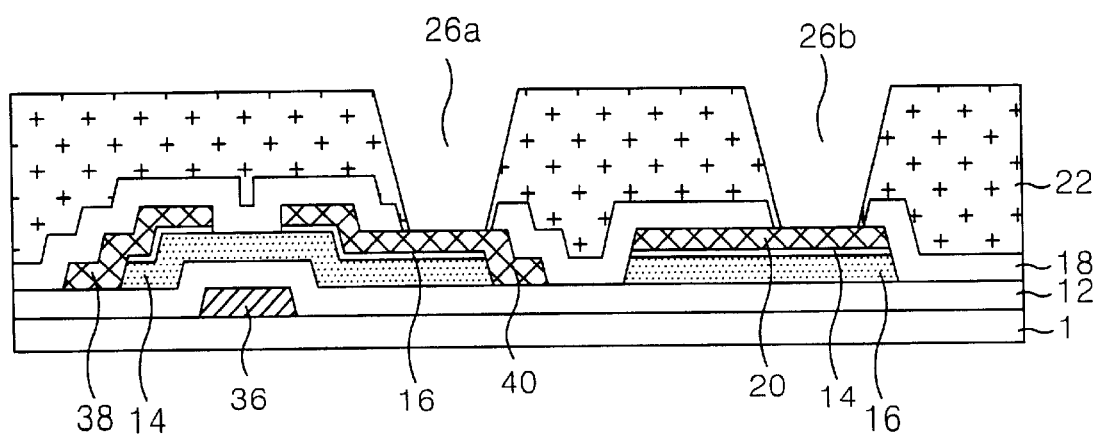
Figure 4F:
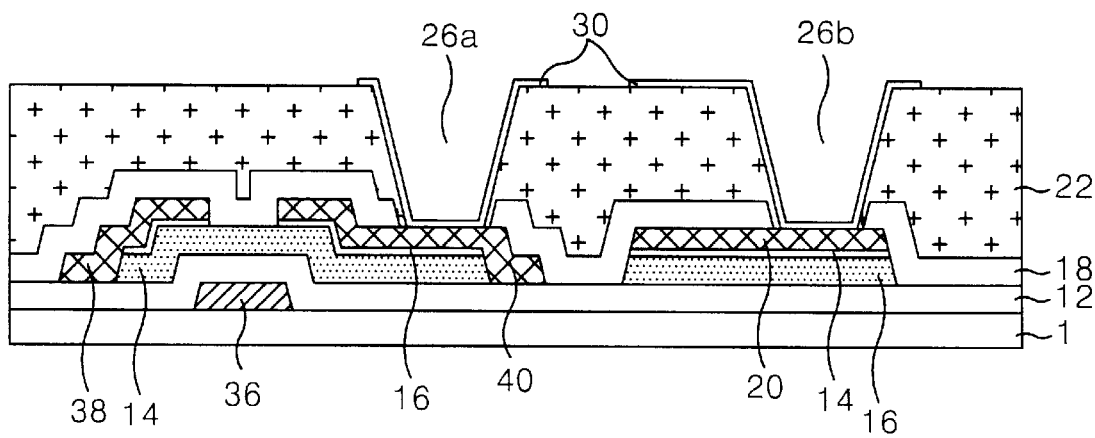
Figure 4G:
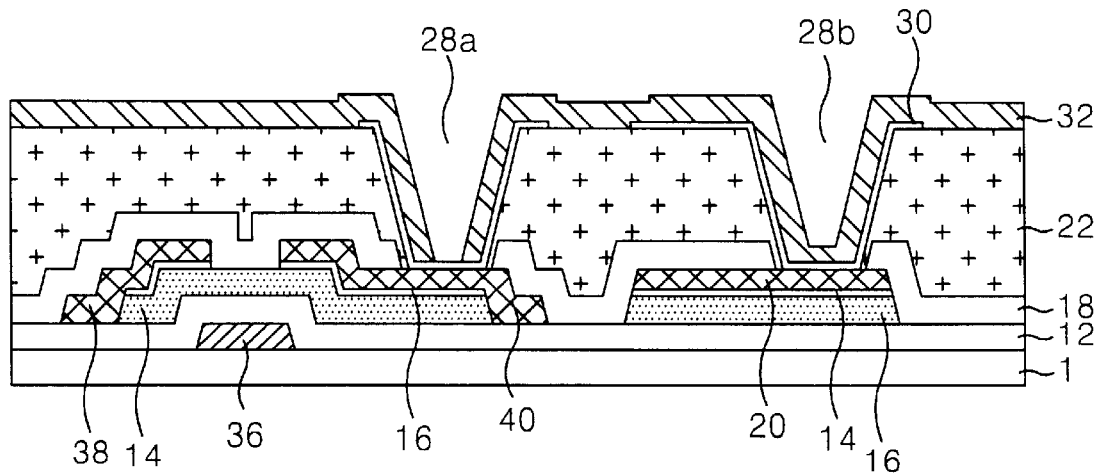
Figure 4H:
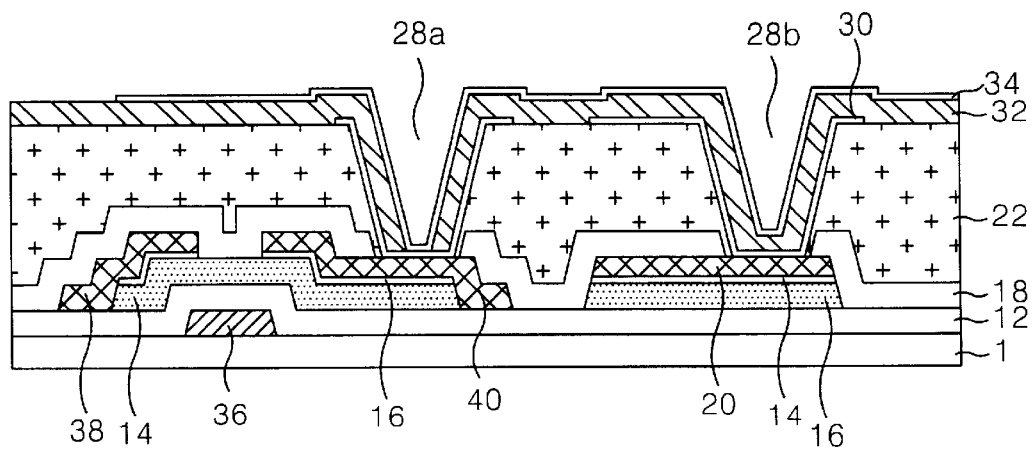
Figure 5:
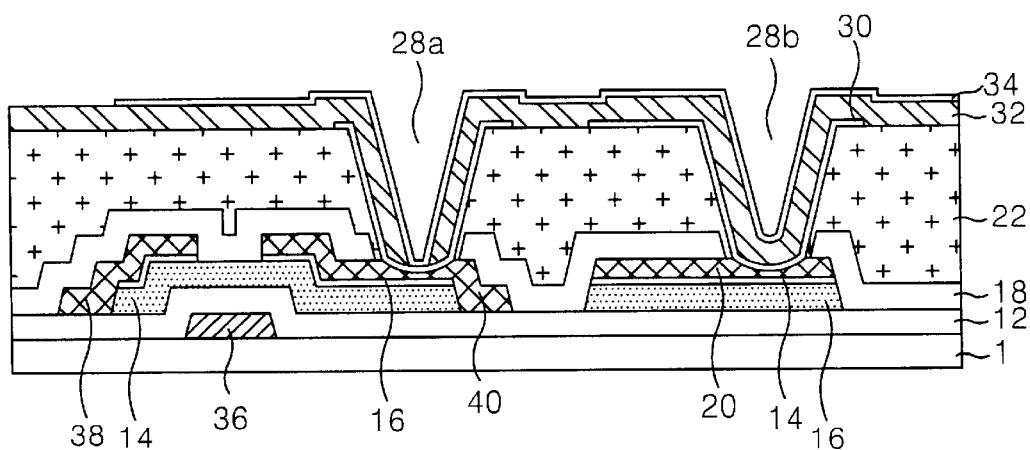
FIG. 5 is a section view of the X-ray detecting device for showing an over-etching phenomenon when the ground electrode and the drain electrode are formed from molybdenum.
Figure 6:
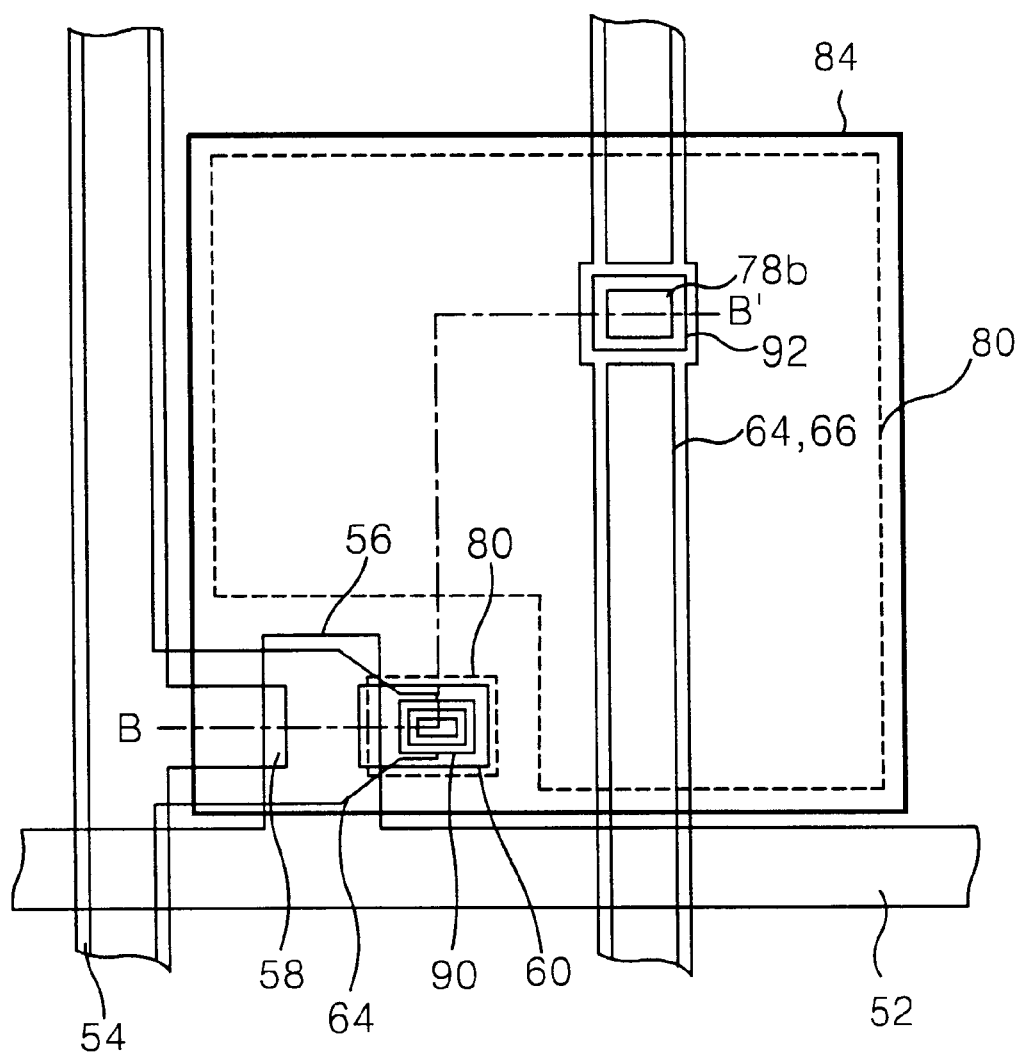
FIG. 6 is a plan view showing a structure of an X-ray detecting device according to an embodiment of the present invention.
Figure 7:
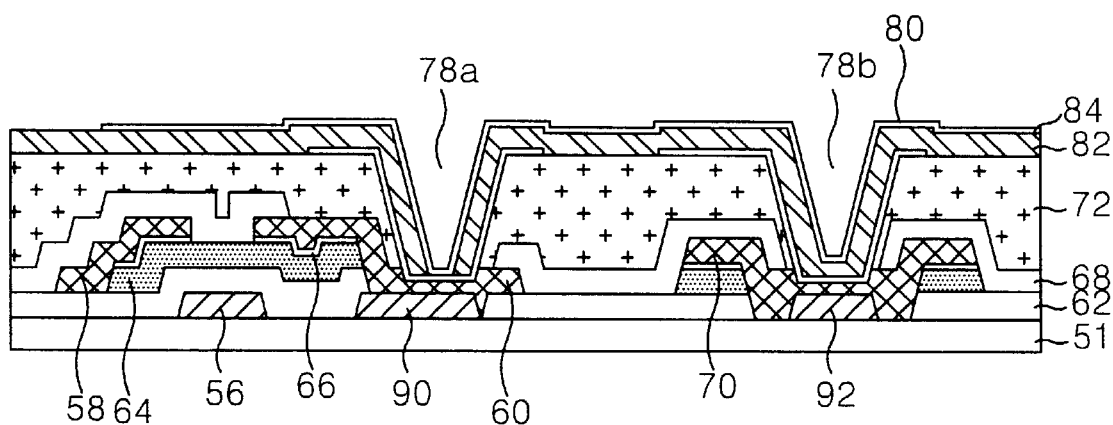
FIG. 7 is a section view of the X-ray detecting device taken along the B–B' line in FIG. 6.

Referring to FIG. 6 and FIG. 7, there is shown an X-ray detecting device according to an embodiment of the present invention.

In a substrate 51 of the X-ray detecting device, a pixel electrode 84 is formed at a unit pixel area defined by a gate line 52 and a data line 54. A charging capacitor Cst is formed by the pixel electrode 84 and a transparent electrode 80 positioned at the lower portion of the pixel electrode 84 with having an organic insulating layer 82 therebetween. A ground electrode 70 is formed in a direction crossing the pixel electrode 84 to reset the residual electric charges of the charging capacitor Cst. The ground electrode 70 is electrically coupled, via a ground contact hole 76b, to the transparent electrode 80.

The thin film transistor (TFT) is formed at an intersection between the data line 54 and the gate line 52. The TFT consists of a gate electrode 56 extended from the gate line 52, a source electrode 58 extended from the data line 54, a drain electrode 60 connected, via drain contact holes 74a, 76a and 78a, to the pixel electrode 84, and semiconductor layers 64 and 66 for defining a conductive channel between the source electrode 58 and the drain electrode 60.

Under the ground electrode 70 and the drain electrode 60, first and second auxiliary electrodes 90 and 92 are formed from aluminum-neodymium/molybdenum (AlNd/Mo) like the gate electrode 56. Even though the ground electrode 70 and the drain electrode 60 are over-etched simultaneously with a patterning of the organic insulating layer 72, the first and second auxiliary electrodes 90 and 92 are electrically connected to the transparent electrode 80.

FIGS. 8A to 8I and FIGS. 9A 9I show a method of fabricating the X-ray detecting device shown in FIG. 6 step by step.

Figure 8A:
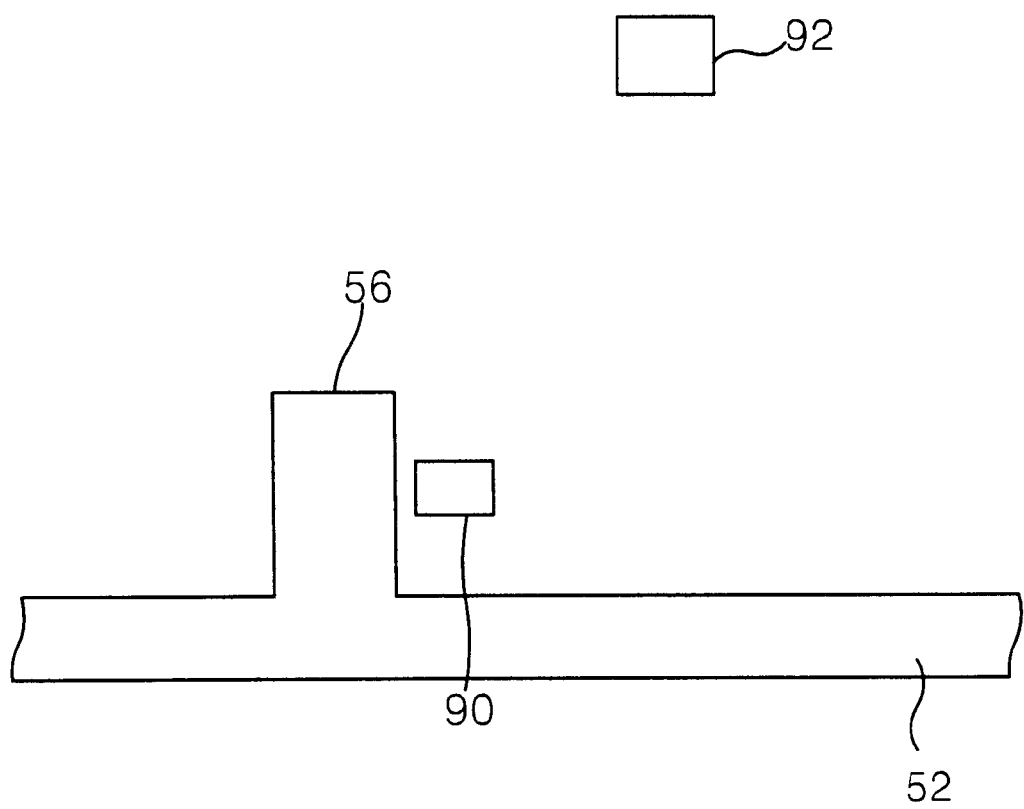
FIG. 8A to FIG. 8I are plan views showing a method of fabricating the X-ray detecting device in FIG. 6.
Figure 9A:
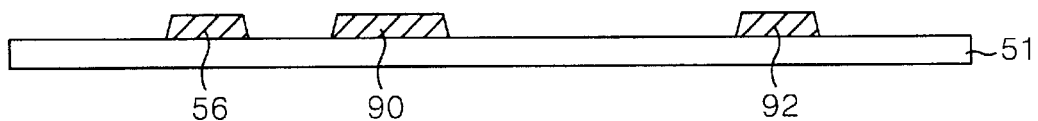
FIG. 9A to FIG. 9I are section views showing a method of fabricating the X-ray detecting device in FIG. 7.

Referring first to FIG. 8A and FIG. 9A, the gate line 52, the gate electrode 56 and the first and second auxiliary electrodes 90 and 92 are provided on the substrate 51.

The gate line 52, the gate electrode 56 and the first and second auxiliary electrodes 90 and 92 are formed by depositing a metal material using a deposition technique such as a sputtering, etc. to form a conductive layer and then patterning the conductive layer. The first auxiliary electrode 90 is positioned at the lower portion of the drain electrode 60 to be formed later while the second auxiliary electrode 92 is positioned at the lower portion of the ground electrode 70 to be formed later. The gate line 52, the gate electrode 36 and the first and second auxiliary electrodes 90 and 92 are formed from a metal material such as an aluminum ally, and are preferably formed from aluminum-neodymium/molybdenum (AlNd/Mo).

Figure 8B:
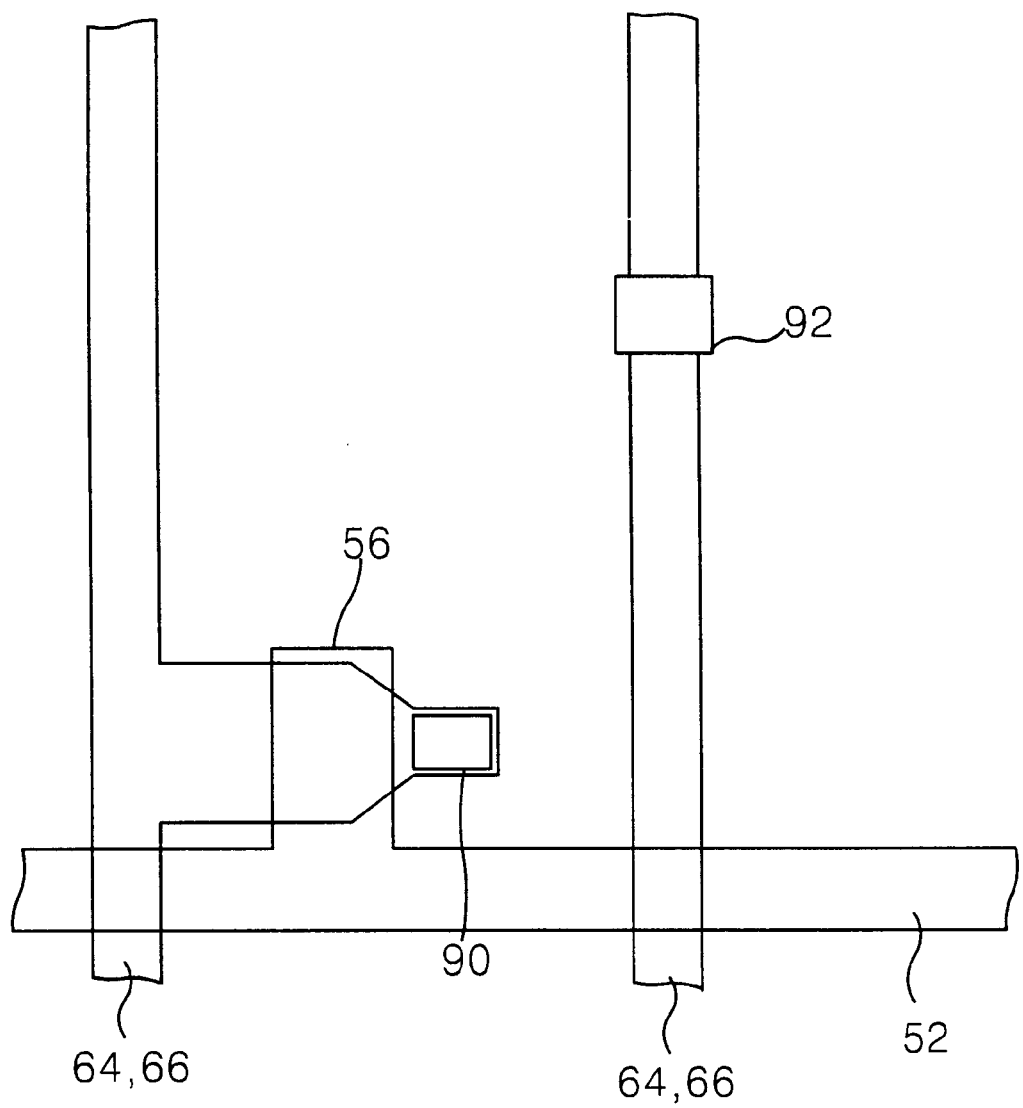
Figure 9B:
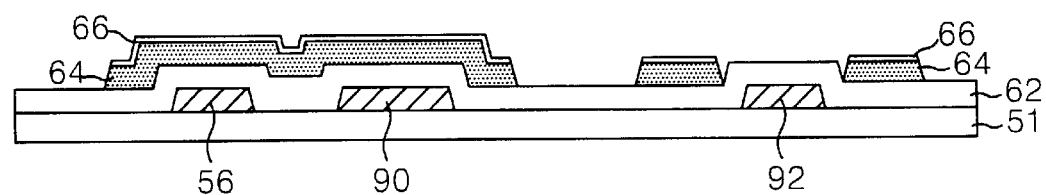

Referring to FIG. 8B and FIG. 9B, an active layer 64 and an ohmic contact layer 66 are provided on a gate insulating film 62.

The gate insulating film 62 is formed by entirely depositing an insulating material, such as silicon nitride ($SiN_x$) or silicon oxide ($SiO_x$), onto the substrate 51 by the plasma enhanced chemical vapor deposition (PECVD) technique in such a manner to cover the gate line 52, the gate electrode 56 and the first and second auxiliary electrodes 90 and 92.

The active layer 64 and the ohmic contact layer 66 are formed by sequentially disposing first and second semiconductor materials on the gate insulating film 62 and then patterning them. The active layer 64 and the ohmic contact layer 66 at the TFT area are formed in such a manner to correspond to the gate electrode 56 and the first auxiliary electrode 90. The active layer 64 and the ohmic contact layer 66 at the ground area are separately formed with having the second auxiliary electrode 92 therebetween such that the active layer 64 and the ohmic contact layer 66 is not formed on the second auxiliary electrode 92 in order to prevent step coverage between the ground electrode 70 and the transparent electrode 80 to be formed later.

The active layer 64 is formed from a first semiconductor material, that is, amorphous silicon that is not doped with an impurity. On the other hand, the ohmic contact layer 66 is formed from a second semiconductor material, that is, amorphous silicon doped with an n-type or p-type impurity at a high concentration.

Figure 8C:
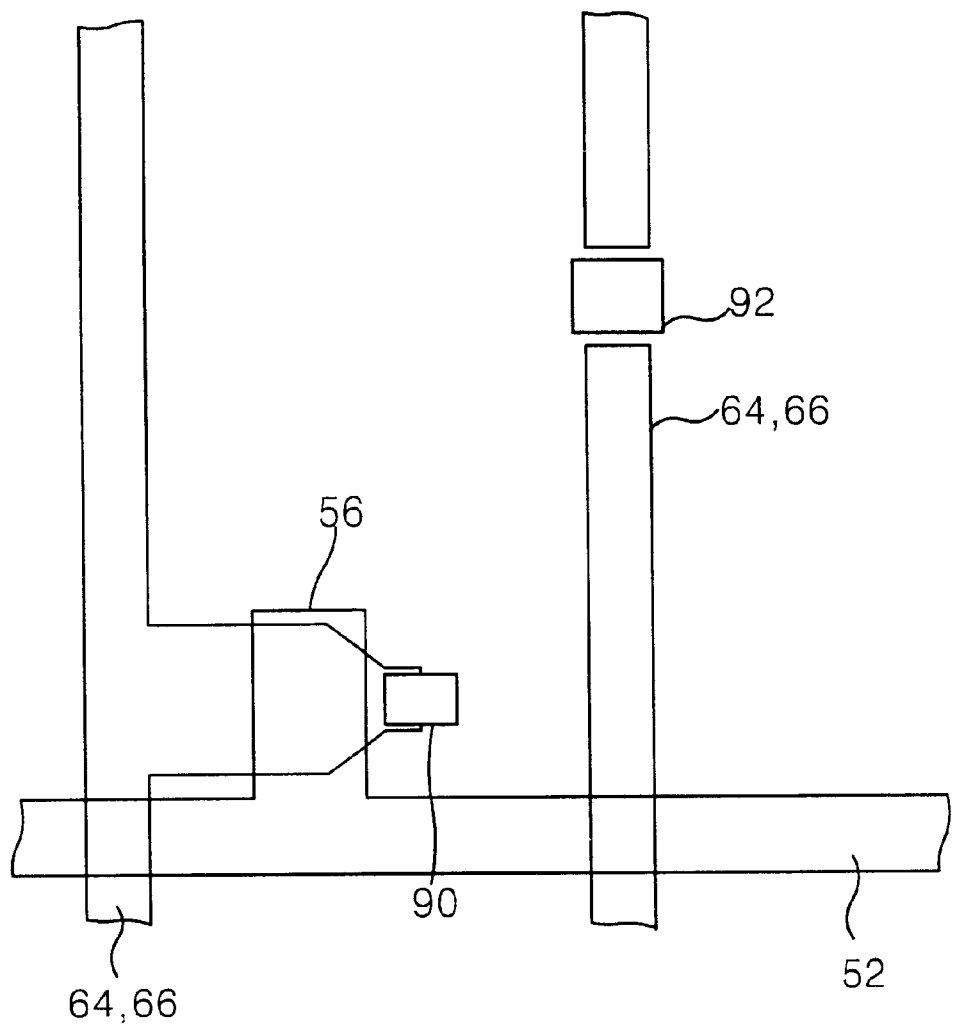
Figure 9C:
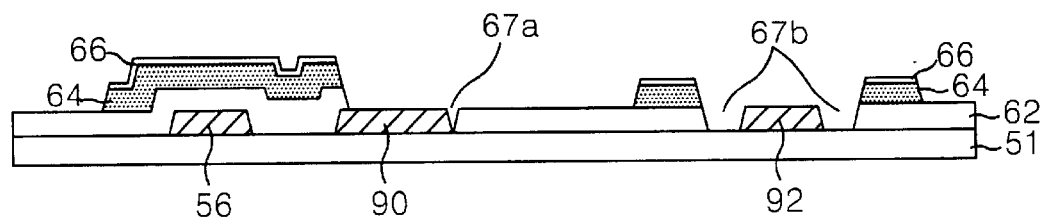

Referring to FIG. 8C and FIG. 9C, a first ground contact hole 67b and a first drain contact hole 67a are formed such that the first and second auxiliary electrodes 90 and 92 on the substrate 51 are exposed.

A photoresist pattern is formed by coating a photoresist on the gate insulating film 62 and then exposing and developing the photoresist using a desired pattern of mask. Then, the first ground contact hole 67b and the first drain contact hole 67a are formed by etching the active layer 64 and the ohmic contact layer 66 using a gas including HCl, etc. in response to the photoresist pattern and thereafter etching the gate insulating film 62 using a gas including $SF_6$ under this state.

Figure 8D:
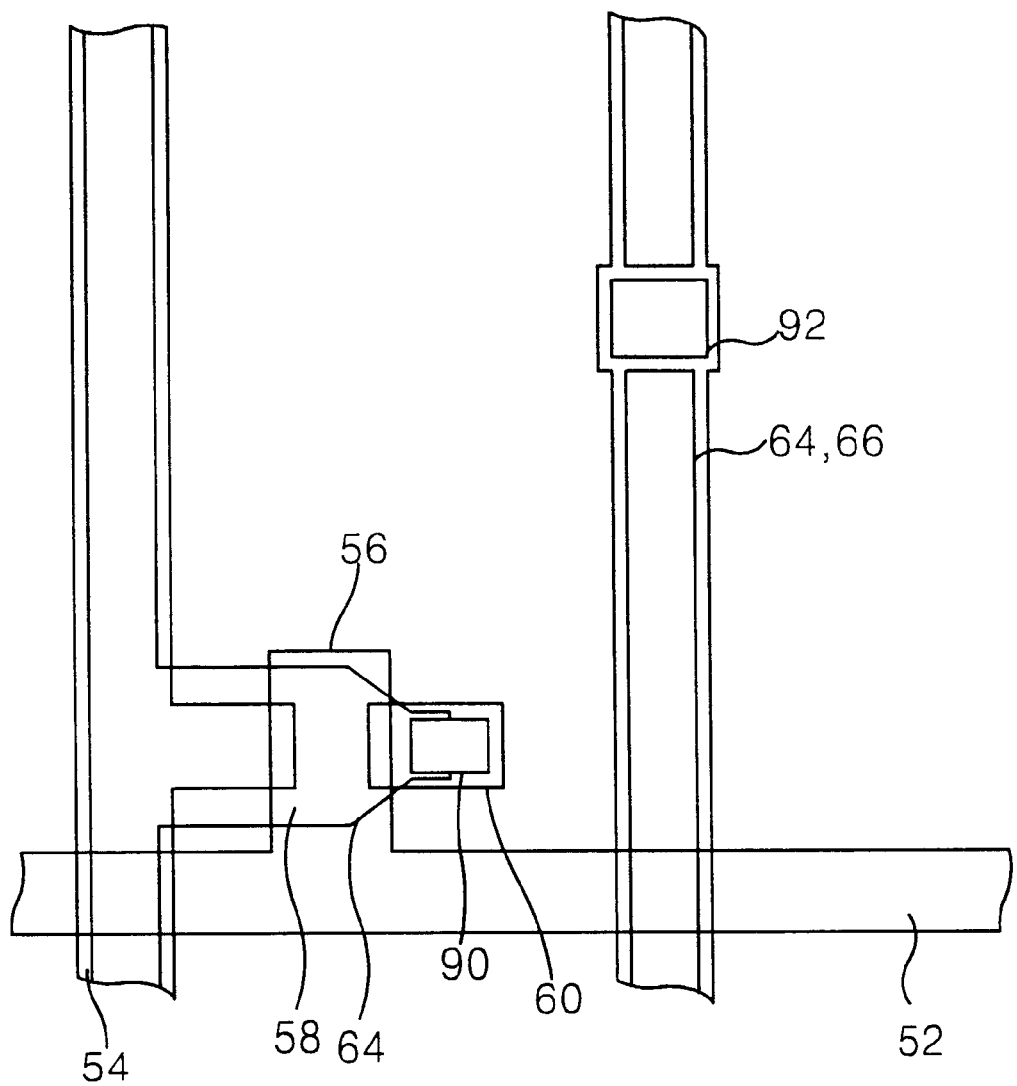
Figure 9D:
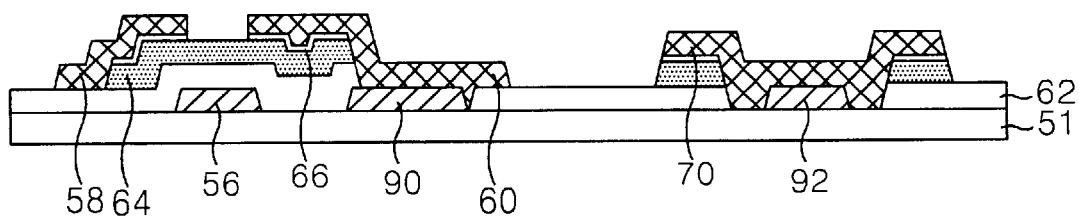

Referring to FIG. 8D and FIG. 9D, the data line 54, the ground electrode 70, the source electrode 58 and the drain electrode 60 are provided on the gate insulating film 62.

The data line 54, the ground electrode 70 and the source and drain electrodes 58 and 60 are formed by depositing a metal material using the CVD technique or the sputtering technique and then patterning the metal material. After the source and drain electrodes 58 and 60 were patterned, the ohmic contact layer 66 at an area corresponding to the gate electrode 56 also is patterned to expose the active layer 64. A portion of the active layer 64 exposed by the source and drain electrodes 58 and 60 serves as a channel.

The drain electrode 60 is electrically coupled to the first auxiliary electrode 90 while the ground electrode 70 is electrically coupled to the second auxiliary electrode 92. The data line 54, the ground electrode 70, and the source and drain electrodes 58 and 60 are made from molybdenum (Mo).

Figure 8E:
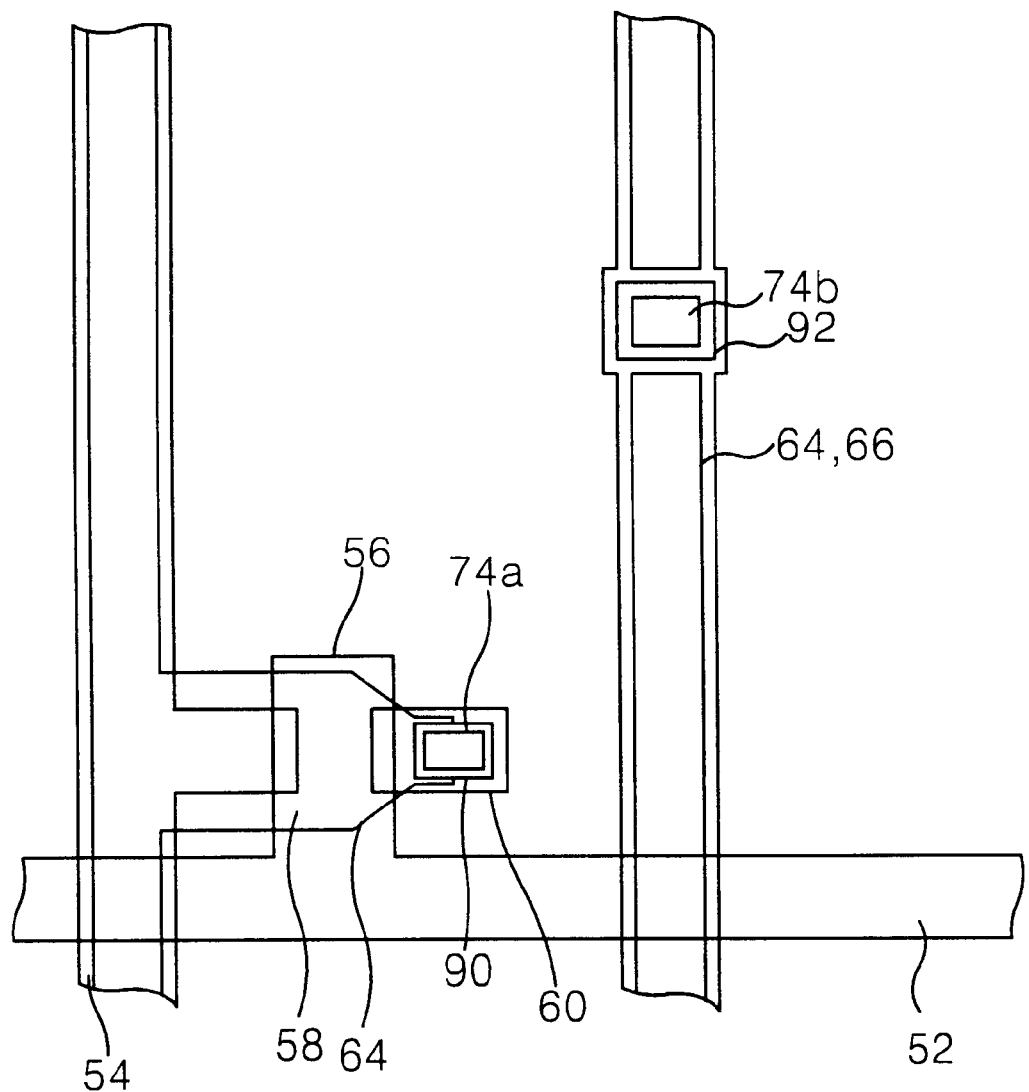
Figure 9E:
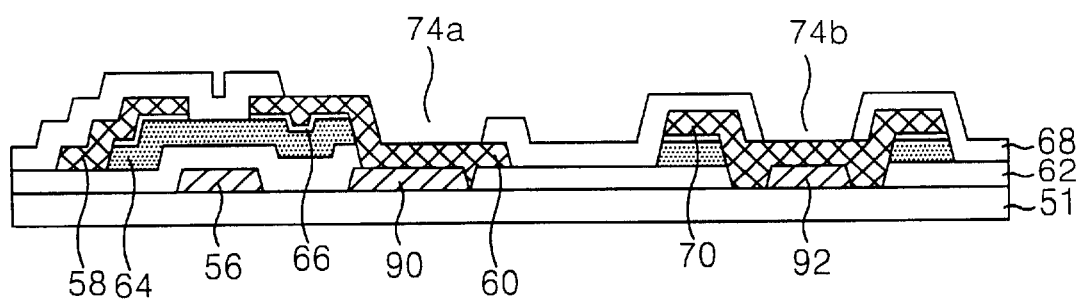

Referring to FIG. 8E and FIG. 9E, a first protective layer 68 are provided on the gate insulating film 62.

The first protective layer 68 is formed by depositing an inorganic insulating material on the gate insulating layer 62 in such a manner to cover the data line 52, the ground electrode 70 and the source and drain electrodes 58 and 60 and then patterning it. The first protective layer 68 is preferably made from silicon nitride ($SiN_x$) or silicon oxide ($SiO_x$), etc.

The first protective layer 68 is provided with a second ground contact hole 74b and a second drain contact hole 74a. The ground electrode 70 is exposed by the second ground contact hole 74b passing through the first protective layer 68. The drain electrode 60 is exposed by the second drain contact hole 74a passing through the first protective film 68. At this time, upon patterning of the first protective layer 68, the drain electrode 60 and the ground electrode 70 may be over-etched.

Figure 8F:
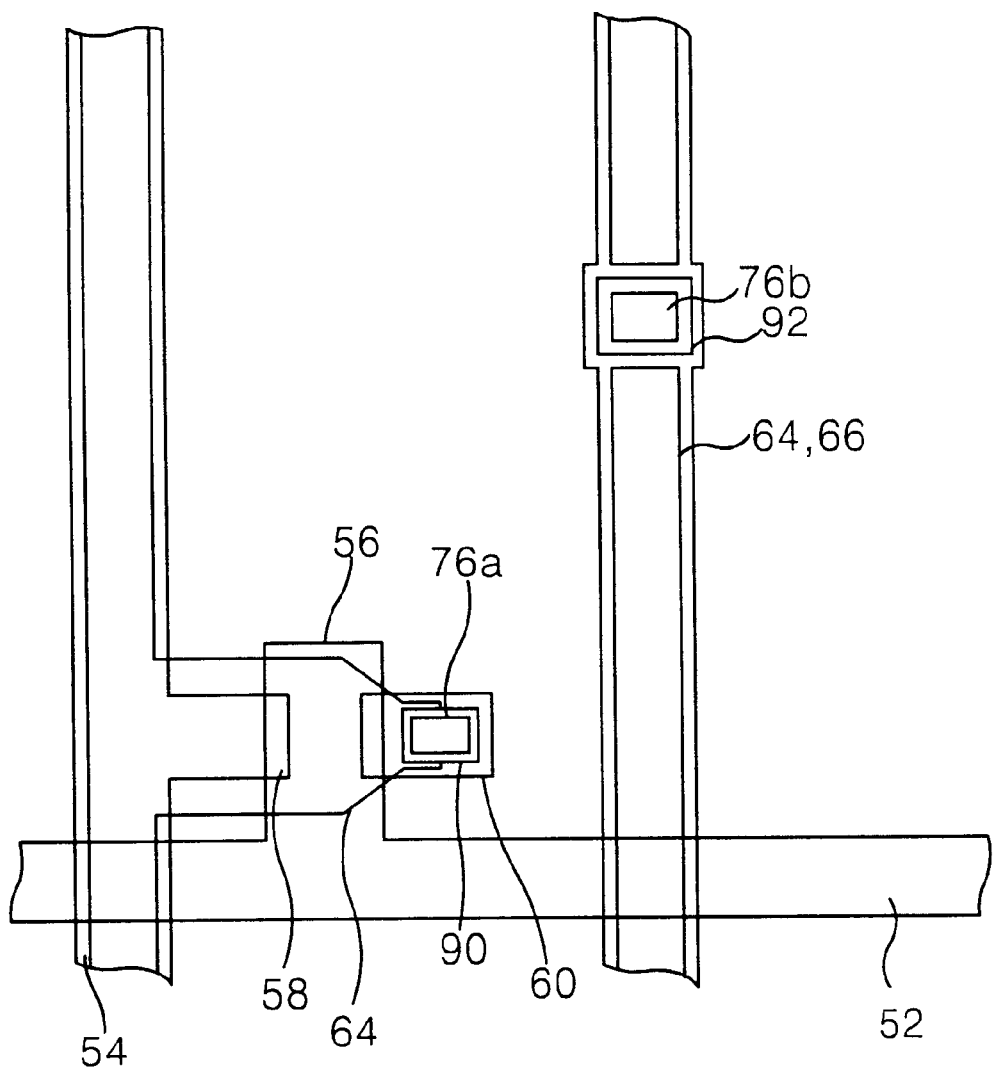
Figure 9F:
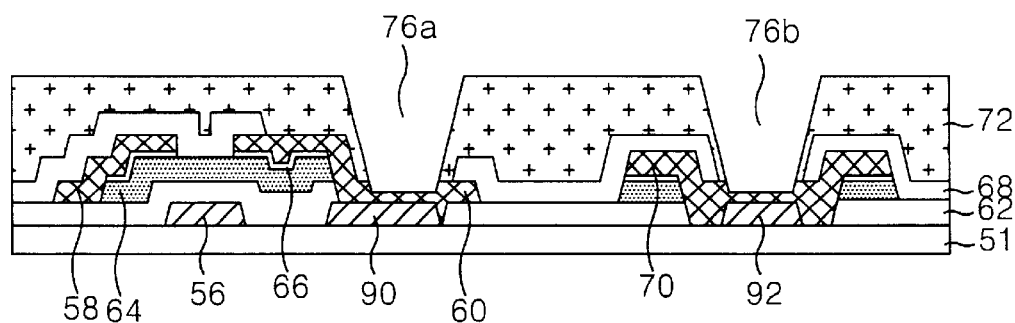

Referring to FIG. 8F and FIG. 9F, an organic insulating layer 72 are provided on the first protective layer 68.

The organic insulating layer 72 is formed by depositing an organic insulating material, such as an acrylic organic compound, Teflon, BCB (benzocyclobutene), Cytop or PFCB (perfluorocyclobutane), etc., on the first protective layer 18 and then patterning it.

This organic insulating layer 72 is provided with a third drain contact hole 76a and a third ground contact hole 76b. Each of the third drain contact hole 76a and the third ground contact hole 76b has a width smaller than or equal to each of the second drain contact hole 74a and the second ground contact hole 74b.

The drain electrode 60 is exposed by the third drain contact hole 76a passing through the organic insulating layer 72 and a portion of the drain electrode 60. The ground electrode 70 is exposed by the third ground contact hole 76b passing through the organic insulating layer 72 and a portion of the ground electrode 70. Alternately, the drain electrode 60 may be passed through to expose the first auxiliary electrode 90 through the third drain contact hole 76a while the ground electrode 70 may be passed through to expose the second auxiliary electrode 92 through the third ground contact hole 76b.

Figure 8G:
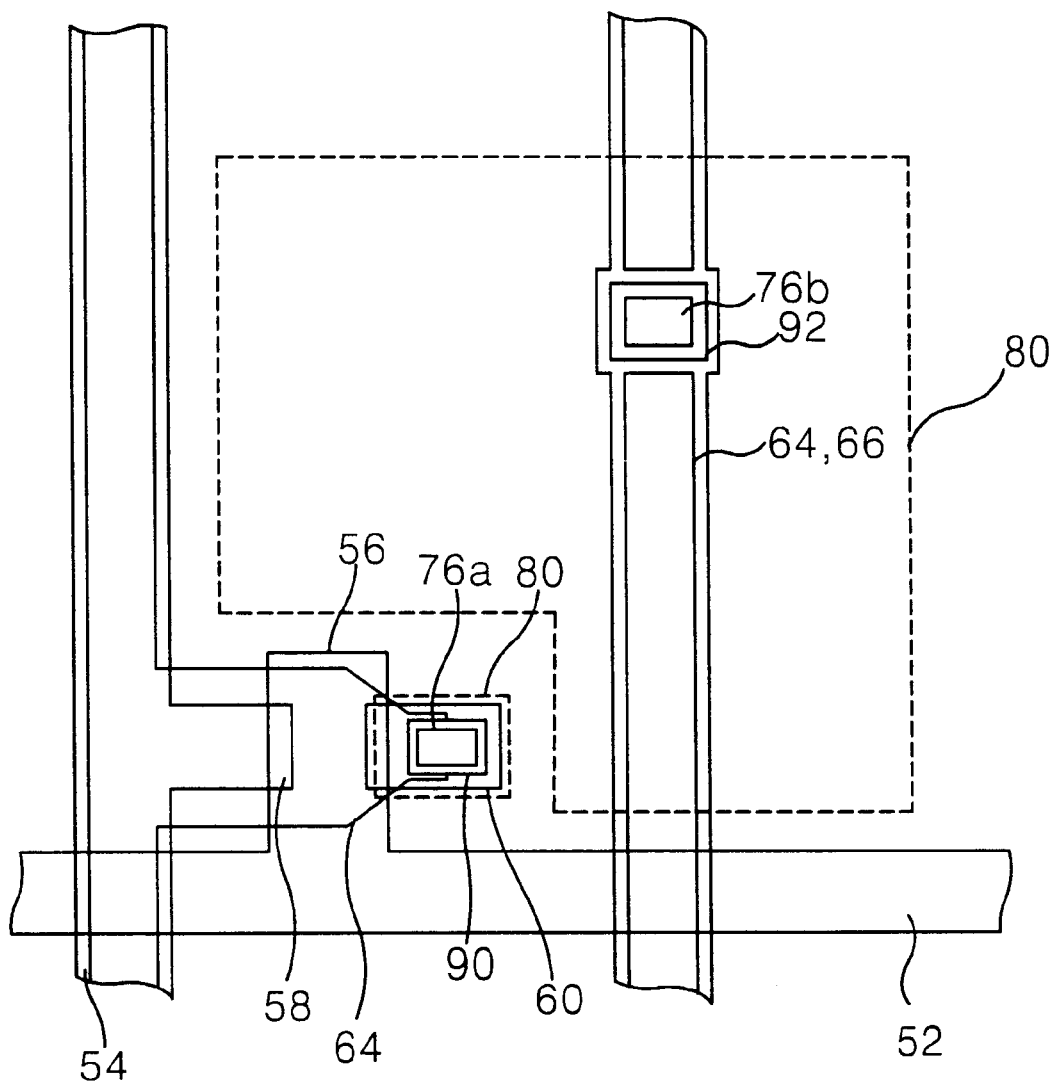
Figure 9G:
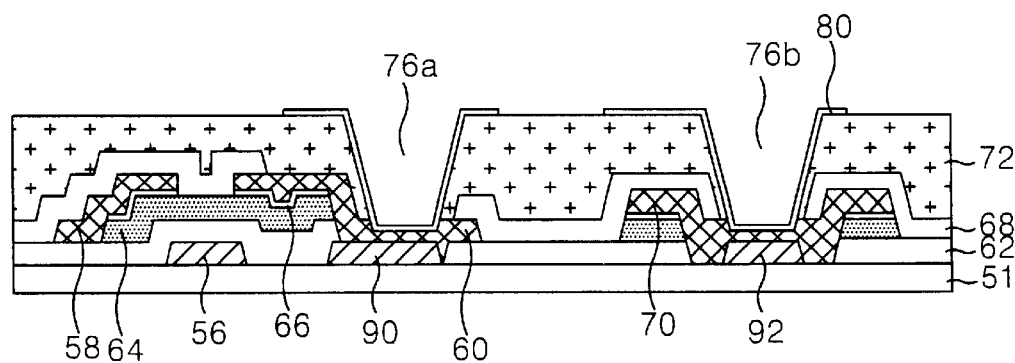

Referring to FIG. 8G and FIG. 9G, a transparent electrode 80 is provided on the organic insulating layer 72.

The transparent electrode 80 is formed by depositing a transparent conductive material onto the organic insulating layer 72 and then patterning the deposited transparent conductive material. The transparent electrode 70 is made from a transparent material such as indium-tin-oxide (ITO), indium-zinc-oxide (IZO) or indium-tin-zinc-oxide (ITZO).

The transparent electrode 70 is electrically connected, via the third drain contact hole 76a, to the drain electrode 60 while being electrically connected, via the third ground contact hole 76b, to the ground electrode 70.

Figure 8H:
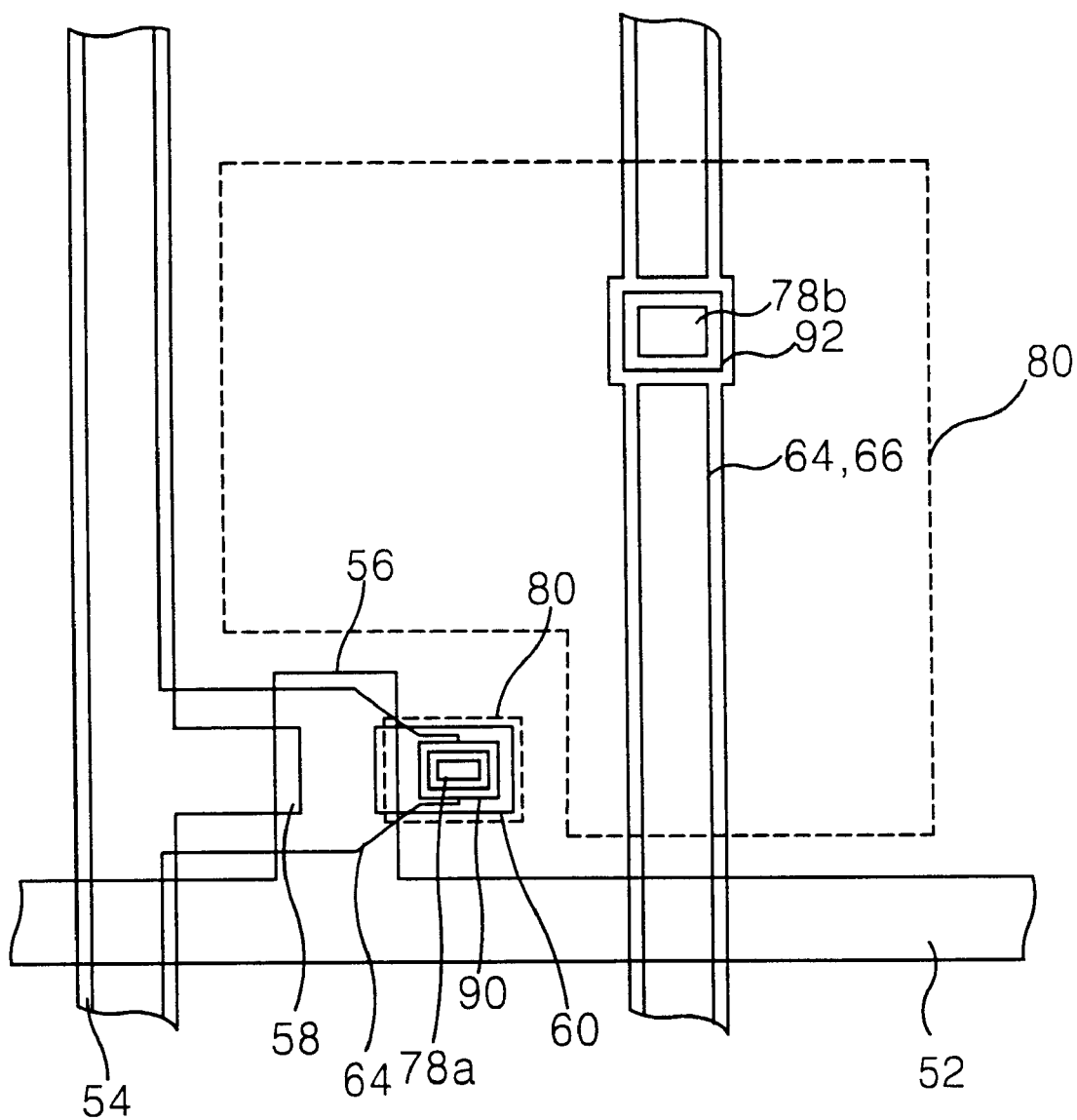
Figure 9H:
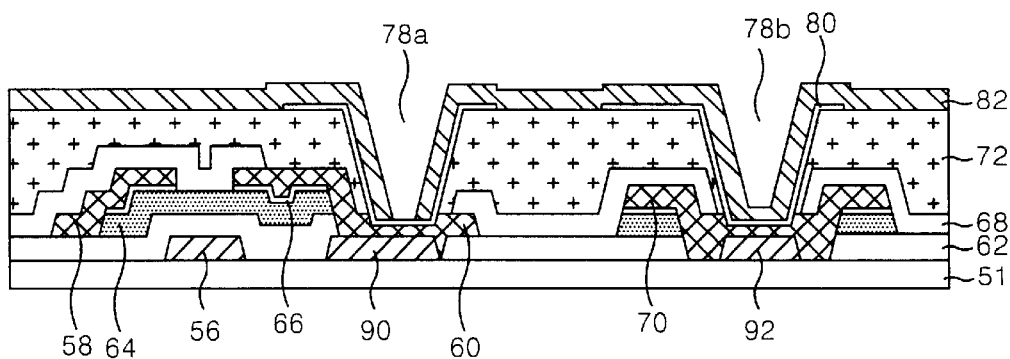

Referring to FIG. 8H and FIG. 9H, a second protective layer 82 is provided on the organic insulating layer 72.

The second protective layer 82 is formed by depositing an insulating material onto the organic insulating layer 72 and then patterning it in such a manner to cover the transparent electrode 80.

The second protective layer 82 is provided with a fourth drain contact hole 78a and a fourth ground contact hole 78b. Each of the fourth drain contact hole 78a and the fourth ground contact hole 78b has a width smaller than each of the third drain contact hole 76a and the third ground contact hole 76b. The transparent electrode 80 is exposed by the fourth drain contact hole 78a passing through the second protective layer 82.

Figure 8I:
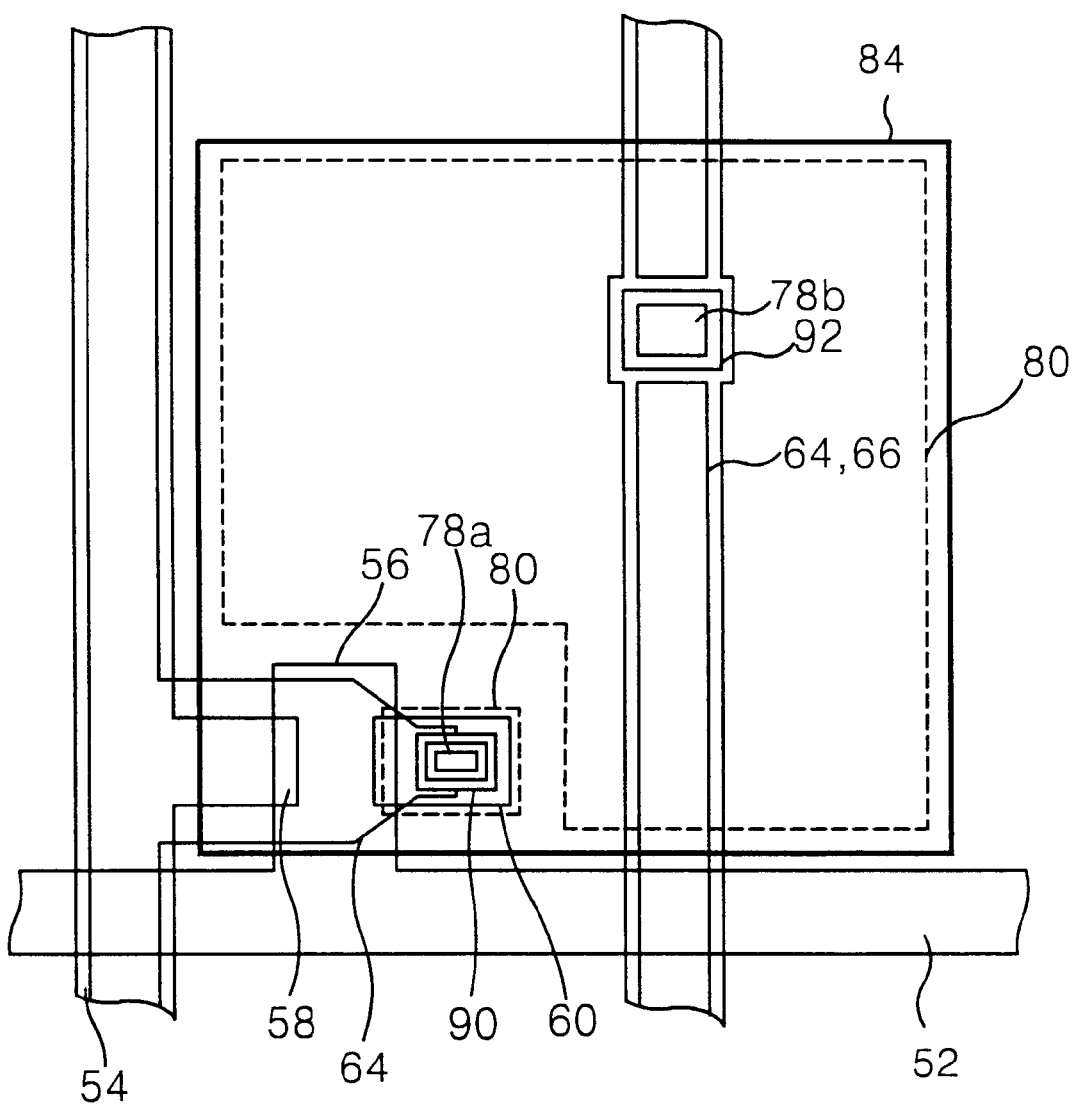
Figure 9I:
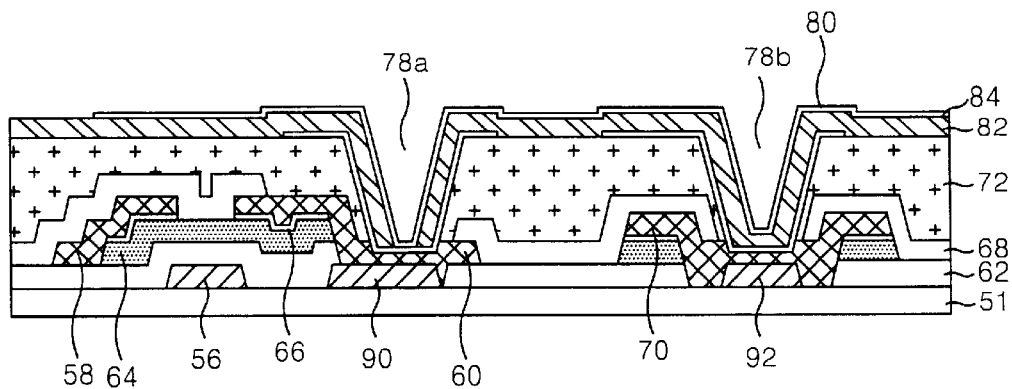

Referring to FIG. 8I and FIG. 9I, the pixel electrode 84 is provided on the second protective layer 82.

The pixel electrode 84 is formed by depositing a transparent conductive material on the second protective layer 82 and then patterning the deposited transparent conductive material.

The pixel electrode 84 is electrically connected, via the second to fourth drain contact holes 74a, 76a and 78a, to the drain electrode 60. The pixel electrode 84 is made from a transparent conductive material such as indium-tin-oxide (ITO), indium-zinc-oxide (IZO) or indium-tin-zinc-oxide (ITZO).

As described above, according to the present invention, the first and second auxiliary electrodes are formed from the same metal material as the gate electrode. Accordingly, the first and second auxiliary electrodes are provided such that the drain electrode and the ground electrode are electrically connected to the transparent electrode with the aid of the first and second auxiliary electrodes even though they are over-etched.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention.

Accordingly, the scope of the invention shall be determined only by the appended claims and their equivalents.

What is claimed is:

1. An X-ray detecting device, comprising:
   an auxiliary electrode and a gate electrode on a substrate;
   a drain electrode electrically connected to the auxiliary electrode; and
   a transparent electrode electrically connected, via a contact hole passing through the drain electrode, to the auxiliary electrode.

2. The X-ray detecting device according to claim 1, further comprising:
   a gate insulating film covering the auxiliary electrode;
   a semiconductor layer to correspond to the auxiliary electrode and the gate electrode; and
   a contact hole passing through the gate insulating film and the semiconductor layer to expose the auxiliary electrode.

3. The X-ray detecting device according to claim 1, wherein the auxiliary electrode is formed from aluminum-neodymium/molybdenum (AlNd/Mo).

4. The X-ray detecting device according to claim 1, wherein the drain electrode is formed from molybdenum (Mo).

5. The X-ray detecting device as recited in claim 1, wherein the auxiliary electrode and gate electrode are made of the same material.

6. The X-ray detecting device as recited in claim 5, wherein the auxiliary electrode and gate electrode are formed from aluminum-neodymium/molybdenum (AlNd/Mo).

7. An X-ray detecting device, comprising:
   an auxiliary electrode and gate electrode on a substrate;
   a ground electrode electrically connected to the auxiliary electrode; and
   a transparent electrode electrically connected, via a contact hole passing through the ground electrode, to the auxiliary electrode.

8. The X-ray detecting device according to claim 7, further comprising:
   a gate insulating film on the substrate covering the auxiliary electrode;
   a semiconductor layer formed on the gate insulating film; and
   a contact hole passing through the gate insulating film and the semiconductor layer to expose the auxiliary electrode.

9. The X-ray detecting device according to claim 7, wherein the auxiliary electrode is formed from aluminum-neodymium/molybdenum (AlNd/Mo).

10. The X-ray detecting device according to claim 7, wherein the ground electrode is formed from molybdenum (Mo).

11. The X-ray detecting device as recited in claim 7, wherein the auxiliary electrode and gate electrode are formed from aluminum-neodymium/molybdenum (AlNd/Mo).

12. The X-ray detecting device as recited in claim 11, wherein the auxiliary electrode and gate electrode are formed from aluminum-neodymium/molybdenum (AlNd/Mo).

13. A method of fabricating an X-ray detecting device, comprising the steps of:
   forming an auxiliary electrode on a substrate simultaneously with a gate electrode;
   forming a gate insulating film on the substrate in such a manner to cover the gate electrode and the auxiliary electrode;
   forming a semiconductor layer on the gate insulating film;
   forming a first contact hole passing through the semiconductor layer and the gate insulating film to expose the auxiliary electrode; and
   forming a source electrode on the gate insulating film and simultaneously forming a drain electrode opposed to the source electrode electrically connected to the auxiliary electrode.

14. The method according to claim 13, further comprising the steps of:
   forming a first protective layer on the gate insulating film in such a manner to cover the source and drain electrodes;
   forming an insulating layer on the first protective layer;
   forming a second contact hole passing through at least one of the insulating layer and the drain electrode;
   forming a transparent electrode electrically connected, via the second contact hole, to at least one of the drain electrode and the auxiliary electrode;
   forming a second protective layer on the insulating layer; and
   forming a pixel electrode electrically connected to the transparent electrode on the second protective layer.

15. The method according to claim 14, wherein the insulating layer is made from an organic insulating material.

16. The method according to claim 14, wherein the first and second protective layers are made from an inorganic insulating material.

17. The method according to claim 13, wherein the auxiliary electrode is formed from aluminum-neodymium/molybdenum (AlNd/Mo).

18. The method according to claim 13, wherein the drain electrode is formed from molybdenum (Mo).

19. The method of fabricating an X-ray detecting device as recited in claim 13, wherein said step of forming an auxiliary electrode further comprising forming said auxiliary electrode and gate electrode of the same material.

20. The method of fabricating an X-ray detecting device as recited in claim 13, wherein the same material is aluminum-neodymium/molybdenum (AlNd/Mo).

21. A method of fabricating an X-ray detecting device, comprising the steps of:
   forming an auxiliary electrode on a substrate simultaneously with a gate electrode;
   forming a gate insulating film on the substrate in such a manner to cover the auxiliary electrode;
   forming a semiconductor layer on the gate insulating film;
   forming a first contact hole passing through the semiconductor layer and the gate insulating film to expose the auxiliary electrode; and
   forming a ground electrode electrically connected to the auxiliary electrode on the substrate.

22. The method according to claim 21, further comprising the steps of:
   forming a first protective layer on the gate insulating film in such a manner to cover the ground electrode;
   forming an insulating layer on the first protective layer;
   forming a second contact hole passing through at least one of the insulating layer and the ground electrode;
   forming a transparent electrode electrically connected, via the second contact hole, to at least one of the ground electrode and the auxiliary electrode;

forming a second protective layer on the insulating layer; and forming a pixel electrode on the second protective layer.

23. The method according to claim 22, wherein the auxiliary electrode is formed from aluminum-neodymium/molybdenum (AlNd/Mo).

24. The method according to claim 22, wherein the ground electrode is formed from molybdenum (Mo).

25. The method according to claim 22, wherein the first and second protective layers are made from an inorganic insulating material.

26. The method according to claim 22, wherein the insulating layer is made from an organic insulating material.

27. The method of fabricating an X-ray detecting device as recited in claim 21, wherein said step of forming an auxiliary electrode further comprising forming said auxiliary electrode and gate electrode of the same material.

28. The method of fabricating an X-ray detecting device as recited in claim 27, wherein the same material is aluminum-neodymium/molybdenum (AlNd/Mo).

* * * * *